(12) United States Patent
Matsunaga et al.

(10) Patent No.: US 8,980,812 B2
(45) Date of Patent: *Mar. 17, 2015

(54) TREATMENT LIQUID FOR INHIBITING PATTERN COLLAPSE IN MICROSTRUCTURES, AND MICROSTRUCTURE MANUFACTURING METHOD USING SAID TREATMENT LIQUID

(75) Inventors: Hiroshi Matsunaga, Tokyo (JP); Masaru Ohto, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 128 days.

This patent is subject to a terminal disclaimer.

(21) Appl. No.: 13/820,899

(22) PCT Filed: Jul. 14, 2011

(86) PCT No.: PCT/JP2011/066158
§ 371 (c)(1),
(2), (4) Date: Mar. 5, 2013

(87) PCT Pub. No.: WO2012/032856
PCT Pub. Date: Mar. 15, 2012

(65) Prior Publication Data
US 2013/0165365 A1 Jun. 27, 2013

(30) Foreign Application Priority Data
Sep. 8, 2010 (JP) .................................. 2010-200783

(51) Int. Cl.
C11D 7/32 (2006.01)
H01L 21/02 (2006.01)
B81C 1/00 (2006.01)

(52) U.S. Cl.
CPC .......... *H01L 21/0206* (2013.01); *C11D 7/3209* (2013.01); *C11D 7/3281* (2013.01); *B81C 1/00825* (2013.01)
USPC .............................. 510/175; 510/176; 134/1.3

(58) Field of Classification Search
CPC ..................................................... C11D 11/0047
USPC .................................. 510/175, 176; 134/1.3
See application file for complete search history.

(56) References Cited

U.S. PATENT DOCUMENTS

2004/0043153 A1* 3/2004 Okuhama et al. ............. 427/307
2008/0269096 A1 10/2008 Visintin et al.

(Continued)

FOREIGN PATENT DOCUMENTS

JP 2000 196038 7/2000
JP 2004 184648 7/2004

(Continued)

OTHER PUBLICATIONS

International Search Report Issued Oct. 18, 2011 in PCT/JP11/66158 Filed Jul. 14, 2011.

*Primary Examiner* — Gregory Webb
(74) *Attorney, Agent, or Firm* — Oblon, McClelland, Maier & Neustadt, L.L.P.

(57) ABSTRACT

There are provided a processing liquid for suppressing pattern collapse of a microstructure which includes at least one compound selected from the group consisting of an imidazolium halide containing an alkyl group having 12, 14 or 16 carbon atoms, a pyridinium halide containing an alkyl group having 14 or 16 carbon atoms and an ammonium halide containing an alkyl group having 16 or 18 carbon atoms, and water; and a method for producing a microstructure formed of silicon oxide using the processing liquid.

17 Claims, 1 Drawing Sheet

(56) References Cited

U.S. PATENT DOCUMENTS

2012/0181249 A1* 7/2012 Ohto et al. .................. 216/13
2013/0171828 A1* 7/2013 Matsunaga et al. ......... 438/706

FOREIGN PATENT DOCUMENTS

| | | |
|---|---|---|
| JP | 2004 288710 | 10/2004 |
| JP | 2005 309260 | 11/2005 |
| JP | 2006 163314 | 6/2006 |
| JP | 2007 335892 | 12/2007 |
| JP | 2008 537343 | 9/2008 |
| JP | 2008 285508 | 11/2008 |
| JP | 2009 122031 | 6/2009 |
| JP | 2009 229572 | 10/2009 |
| JP | 2010 114467 | 5/2010 |

* cited by examiner

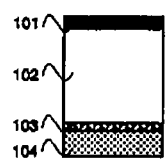 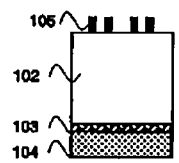 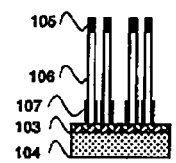 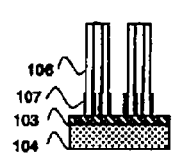 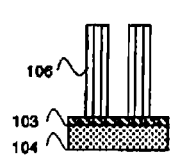
Fig.1(a)  Fig.1(b)  Fig.1(c)  Fig.1(d)  Fig.1(e)
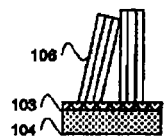
Fig.1(f)

TREATMENT LIQUID FOR INHIBITING PATTERN COLLAPSE IN MICROSTRUCTURES, AND MICROSTRUCTURE MANUFACTURING METHOD USING SAID TREATMENT LIQUID

This application is a 371 of PCT/JP2011/066158, filed Jul. 14, 2011. Priority to Japanese patent application 2010-200783, filed Sep. 8, 2010, is claimed.

TECHNICAL FIELD

The present invention relates to a processing liquid for suppressing pattern collapse of a microstructure, and a method for producing a microstructure using the processing liquid.

BACKGROUND ART

The photolithography technique has been employed as a formation and processing method of a device having a microstructure used in a wide range of fields of art including a semiconductor device, a circuit board and the like. In these fields of art, reduction of size, increase of integration degree and increase of speed of a semiconductor device considerably proceed associated with the highly sophisticated demands on capabilities, which bring about continuous miniaturization and increase of aspect ratio of a resist pattern used for photolithography. However, the progress of miniaturization of the resist pattern causes pattern collapse as a major problem.

It has been known that upon drying the resist pattern to remove a processing liquid used in wet processing (which is mainly a rinsing treatment for washing away a developer solution) therefrom after developing the resist pattern, the collapse of the resist pattern is caused by the stress derived by the surface tension of the processing liquid. For preventing the collapse of the resist pattern, such methods have been proposed as a method of replacing the rinsing liquid by a liquid having a low surface tension using a nonionic surfactant, a compound soluble in an alcohol solvent, or the like (see, for example, Patent Documents 1 and 2), and a method of hydrophobizing the surface of the resist pattern (see, for example, Patent Document 3).

In a microstructure formed of a metal, a metal nitride, a metal oxide, a silicon oxide, silicon or the like (except for a resist; hereinafter defined in the same way unless otherwise specified) by the photolithography technique, the strength of the material itself constituting the structure is larger than the strength of the resist pattern itself or the bonding strength between the resist pattern and the substrate, and therefore, the collapse of the structure pattern is hard to occur as compared to the resist pattern. However, associated with the progress of reduction of size, increase of integration degree and increase of speed of a semiconductor device and a micromachine, the pattern collapse of the structure is becoming a major problem due to miniaturization and increase of aspect ratio of the pattern.

Under these circumstances, in order to solve the problem of pattern collapse of the microstructure, there has been proposed the method of forming a hydrophobic protective film using a surfactant (see, for example, Patent Document 4). However, in Patent Document 4, there are no descriptions concerning details of the surfactant including kind (nonionic, anionic or cationic, etc.), product names, concentrations or the like.

PRIOR ART DOCUMENTS

Patent Documents

Patent Document 1: JP-A-2004-184648
Patent Document 2: JP-A-2005-309260
Patent Document 3: JP-A-2006-163314
Patent Document 4: JP-A-2010-114467

SUMMARY OF THE INVENTION

Problems to be Solved by the Invention

As described above, the current situation is that no effective technique for suppressing pattern collapse has been known in the field of microstructures (in particular, microstructures formed of silicon oxide) such as a semiconductor device and a micromachine.

The present invention has been developed under the circumstances, and an object thereof is to provide a processing liquid that is capable of suppressing pattern collapse of a microstructure formed of silicon oxide, such as a semiconductor device and a micromachine, and a method for producing a microstructure using the processing liquid.

Means for Solving the Problems

As a result of earnest investigations made by the inventors for achieving the object, it has been found that the object can be achieved with a processing liquid including at least one compound selected from the group consisting of an imidazolium halide containing an alkyl group having 12, 14 or 16 carbon atoms, a pyridinium halide containing an alkyl group having 14 or 16 carbon atoms and an ammonium halide containing an alkyl group having 16 or 18 carbon atoms.

The present invention has been accomplished on the basis of the above finding. Accordingly, the present invention relates to the following aspects.

1. A processing liquid for suppressing pattern collapse of a microstructure formed of silicon oxide, including at least one compound selected from the group consisting of an imidazolium halide containing an alkyl group having 12, 14 or 16 carbon atoms, a pyridinium halide containing an alkyl group having 14 ox 16 carbon atoms and an ammonium halide containing an alkyl group having 16 or 18 carbon atoms, and water.

2. The processing liquid as described in the above aspect 1, wherein the alkyl group having 12 carbon atoms is a dodecyl group, the alkyl group having 14 carbon atoms is a tetradecyl group, the alkyl group having 16 carbon atoms is a hexadecyl group, and the alkyl group having 18 carbon atoms is an octadecyl group.

3. The processing liquid as described in the above aspect 1, wherein the imidazolium halide is at least one compound selected from the group consisting of 1-dodecyl-3-methyl imidazolium chloride, 1-tetradecyl-3-methyl imidazolium chloride and 1-hexadecyl-3-methyl imidazolium chloride.

4. The processing liquid as described in the above aspect 1, wherein the pyridinium halide is at least one compound selected from the group consisting of tetradecyl pyridinium chloride, hexadecyl pyridinium chloride, 1-tetradecyl-4-methyl pyridinium chloride and 1-hexadecyl-4-methyl pyridinium chloride.

5. The processing liquid as described in the above aspect 1, wherein the ammonium halide is at least one compound selected from the group consisting of hexadecyl trimethyl ammonium chloride, octadecyl trimethyl ammonium chloride, benzyl dimethyl hexadecyl ammonium chloride and benzyl dimethyl octadecyl ammonium chloride.

6. The processing liquid as described in the above aspect 1, wherein a content of the at least one compound selected from the group consisting of the imidazolium halide, the pyridinium halide and the ammonium halide in the processing liquid is from 10 ppm to 10%.

7. A method for producing a microstructure formed of silicon oxide, including the steps of:
   subjecting a structure to wet etching or dry etching to obtain the microstructure; and
   rinsing the microstructure obtained by the wet etching or dry etching with a processing liquid for suppressing pattern collapse of the microstructure, the processing liquid including at least one compound selected from the group consisting of an imidazolium halide containing an alkyl group having 12, 14 or 16 carbon atoms, a pyridinium halide containing an alkyl group having 14 or 16 carbon atoms and an ammonium halide containing an alkyl group having 16 or 18 carbon atoms, and water.

8. The method as described in the above aspect 7, wherein the microstructure formed of silicon oxide is a semiconductor device or a micromachine.

Advantages of the Invention

According to the present invention, there are provided a processing liquid that is capable of suppressing pattern collapse of a microstructure formed of silicon oxide, such as a semiconductor device and a micromachine, and a method for producing a microstructure using the processing liquid.

BRIEF DESCRIPTION OF THE DRAWINGS

FIG. 1(a) to FIG. 1(f) are schematic cross sectional views showing respective production steps of a microstructure.

PREFERRED EMBODIMENTS FOR CARRYING OUT THE INVENTION (Processing Liquid for Suppressing Pattern Collapse)

The processing liquid of the present invention (i.e., a processing liquid for suppressing pattern collapse) is used for suppressing pattern collapse of a microstructure formed of silicon oxide, and includes at least one compound selected from the group consisting of an imidazolium halide containing an alkyl group having 12, 14 or 16 carbon atoms, a pyridinium halide containing an alkyl group having 14 or 16 carbon atoms and an ammonium halide containing an alkyl group having 16 or 18 carbon atoms, and water.

The term "microstructure formed of silicon oxide" as used herein means a microstructure in which a portion to be processed with the processing liquid is formed of silicon oxide.

It is considered that each of the imidazolium halide containing an alkyl group having 12, 14 or 16 carbon atoms, the pyridinium halide containing an alkyl group having 14 or 16 carbon atoms and the ammonium halide containing an alkyl group having 16 or 18 carbon atoms which are used in the processing liquid of the present invention is adsorbed to the silicon oxide used in the pattern of the microstructure, thereby hydrophobizing the surface of the pattern. The hydrophobization as used in the present invention means that the contact angle of the silicon oxide having been processed with the processing liquid of the present invention with respect to water is 70° or more.

The alkyl group having 12 carbon atoms is preferably a dodecyl group, the alkyl group having 14 carbon atoms is preferably a tetradecyl group, the alkyl group having 16 carbon atoms is preferably a hexadecyl group, and the alkyl group having 18 carbon atoms is preferably an octadecyl group. The compounds having such a straight chain alkyl group can be adsorbed to a silicon oxide material with a high density as compared to those compounds having a branched alkyl group.

In view of practical use, among these halide, preferred is chlorine.

Examples of the imidazolium halide containing an alkyl group having 12, 14 or 16 carbon atoms include 1-dodecyl-3-methyl imidazolium chloride, 1-dodecyl-3-methyl imidazolium bromide, 1-dodecyl-3-methyl imidazolium iodide, 1-methyl-3-dodecyl imidazolium chloride, 1-methyl-3-dodecyl imidazolium bromide, 1-methyl-3-dodecyl imidazolium iodide, 1-dodecyl-2-methyl-3-benzyl imidazolium chloride, 1-dodecyl-2-methyl-3-benzyl imidazolium bromide, 1-dodecyl-2-methyl-3-benzyl imidazolium iodide, 1-tetradecyl-3-methyl imidazolium chloride, 1-tetradecyl-3-methyl imidazolium bromide, 1-tetradecyl-3-methyl imidazolium iodide, 1-methyl-3-tetradecyl imidazolium chloride, 1-methyl-3-tetradecyl imidazolium bromide, 1-methyl-3-tetradecyl imidazolium iodide, 1-hexadecyl-3-methyl imidazolium chloride, 1-hexadecyl-3-methyl imidazolium bromide, 1-hexadecyl-3-methyl imidazolium iodide, 1-hexadecyl-4-methyl imidazolium chloride, 1-hexadecyl-4-methyl imidazolium bromide, 1-hexadecyl-4-methyl imidazolium iodide, 1-methyl-3-hexadecyl imidazolium chloride, 1-methyl-3-hexadecyl imidazolium bromide and 1-methyl-3-hexadecyl imidazolium iodide. Among these imidazolium halides, especially preferred are 1-dodecyl-3-methyl imidazolium chloride, 1-tetradecyl-3-methyl imidazolium chloride and 1-hexadecyl-3-methyl imidazolium chloride.

Examples of the pyridinium halide containing an alkyl group having 14 or 16 carbon atoms include tetradecyl pyridinium chloride, tetradecyl pyridinium bromide, tetradecyl pyridinium iodide, hexadecyl pyridinium chloride, hexadecyl pyridinium bromide, hexadecyl pyridinium iodide, 1-tetradecyl-4-methyl pyridinium chloride, 1-tetradecyl-4-methyl pyridinium bromide, 1-tetradecyl-4-methyl pyridinium iodide, 1-hexadecyl-4-methyl pyridinium chloride, 1-hexadecyl-4-methyl pyridinium bromide and 1-hexadecyl-4-methyl pyridinium iodide. Among these pyridinium halides, especially preferred are tetradecyl pyridinium chloride, hexadecyl pyridinium chloride, 1-tetradecyl-4-methyl pyridinium chloride and 1-hexadecyl-4-methyl pyridinium chloride.

Examples of the ammonium halide containing an alkyl group having 16 or 18 carbon atoms include hexadecyl trimethyl ammonium chloride, hexadecyl trimethyl ammonium bromide, hexadecyl trimethyl ammonium iodide, octadecyl trimethyl ammonium chloride, octadecyl trimethyl ammonium bromide, octadecyl trimethyl ammonium iodide, dimethylethyl hexadecyl ammonium chloride, dimethylethyl hexadecyl ammonium bromide, dimethylethyl hexadecyl ammonium iodide, dimethylethyl octadecyl ammonium chloride, dimethylethyl octadecyl ammonium bromide, dimethylethyl octadecyl ammonium iodide, benzyl dimethyl hexadecyl ammonium chloride, benzyl dimethyl hexadecyl ammonium bromide, benzyl dimethyl hexadecyl ammonium iodide, benzyl dimethyl octadecyl ammonium chloride, benzyl dimethyl octadecyl ammonium bromide and benzyl dimethyl octadecyl ammonium iodide. Among these ammonium halides, especially preferred are hexadecyl trimethyl ammonium chloride, octadecyl trimethyl ammonium chloride, benzyl dimethyl hexadecyl ammonium chloride and benzyl dimethyl octadecyl ammonium chloride.

The processing liquid of the present invention is preferably used in the form of an aqueous solution. Preferred examples of the water used for preparation of the aqueous solution include water, from which metallic ions, organic impurities, particles and the like are removed by distillation, ion exchange, filtering, adsorption treatment or the like, and particularly preferred examples thereof include pure water and ultrapure water.

The processing liquid of the present invention includes the at least one compound selected from the group consisting of an imidazolium halide containing an alkyl group having 12, 14 or 16 carbon atoms, a pyridinium halide containing an alkyl group having 14 or 16 carbon atoms and an ammonium halide containing an alkyl group having 16 or 18 carbon atoms, and water, and may also contain various kinds of additives that are ordinarily used in processing liquids in such a range that does not impair the advantages of the processing liquid.

The content of the at least one compound selected from the group consisting of an imidazolium halide containing an alkyl group having 12, 14 or 16 carbon atoms, a pyridinium halide containing an alkyl group having 14 or 16 carbon atoms and an ammonium halide containing an alkyl group having 16 or 18 carbon atoms (when using two or more kinds of compounds, it means a total content thereon in the processing liquid of the present invention is preferably from 10 ppm to 10%. When the content of the compound is in the range, the advantages of the compound may be sufficiently obtained, and in consideration of handleability, economy and foaming, the content is preferably 5% or less, more preferably from 10 to 2,000 ppm, and still more preferably from 10 to 1,000 ppm. In the case where the compounds do not have sufficient solubility in water to cause phase separation, an organic solvent, such as an alcohol, may be added, and an acid or an alkali may be added to enhance the solubility. Even in the case where the processing liquid is simply turbid white without phase separation, the processing liquid may be used in such a range that does not impair the advantages of the processing liquid, and may be used while stirring to render the processing liquid homogeneous. Furthermore, for avoiding the white turbidity of the processing liquid, the processing liquid may be used after adding an organic solvent, such as an alcohol, an acid or an alkali thereto as similar to the above case.

The processing liquid of the present invention may be suitably used for suppressing pattern collapse of a microstructure, such as a semiconductor device and a micromachine. Preferred examples of the pattern of the microstructure include those patterns obtained from silicon oxide.

The microstructure may be patterned on an insulating film species, such as TEOS (a tetraethoxy ortho silane oxide film) and SiOC-based low dielectric constant films (such as "Black Diamond 2" (tradename) available from Applied Materials Inc., and "Aurora 2.7" and "Aurora 2.4" (tradenames) both available from ASM International N.V.), in some cases, or the insulating film species may be contained as a part of the microstructure in some cases.

The processing liquid of the present invention can exhibit excellent pattern collapse suppressing effect to not only an ordinary microstructure, but also a microstructure with further miniaturization and higher aspect ratio. The aspect ratio as referred herein is a value calculated from (height of pattern/width of pattern), and the processing liquid of the present invention may exhibit excellent pattern collapse suppressing effect to a pattern that has a high aspect ratio of 3 or more, and further 7 or more. The processing liquid of the present invention has excellent pattern collapse suppressing effect to a finer pattern with a pattern size (pattern width) of 300 nm or less, further 150 nm or less, and still further 100 nm or less, and with a pattern size of 50 nm or less and a line/space ratio of 1/1, and similarly to a finer pattern with a pattern distance of 300 nm or less, further 150 nm or less, still further 100 nm or less, and still further 50 nm or less and a cylindrical hollow or cylindrical solid structure.

[Method for Producing Microstructure]

The method for producing a microstructure formed of silicon oxide according to the present invention includes, after wet etching or dry etching, a rinsing step using the processing liquid of the present invention. More specifically, in the rinsing step, it is preferred that the pattern of the microstructure is made in contact with the processing liquid of the present invention by dipping, spray ejecting, spraying or the like, then the processing liquid is replaced by water, and the microstructure is dried. In the case where the pattern of the microstructure and the processing liquid of the present invention are in contact with each other by dipping, the dipping time is preferably from 10 seconds to 30 minutes, more preferably from 15 seconds to 20 minutes, still more preferably from 20 seconds to 15 minutes, and especially preferably from 30 seconds to 10 minutes, and the temperature condition is preferably from 10 to 80° C., more preferably from 15 to 60° C., still more preferably from 25 to 50° C., and especially preferably from 25 to 40° C. The pattern of the microstructure may be rinsed with water before making in contact with the processing liquid of the present invention. The contact between the pattern of the microstructure and the processing liquid of the present invention enables suppression of collapse of the pattern through hydrophobization of the surface of the pattern.

The processing liquid of the present invention may be applied widely to a production process of a microstructure irrespective of the kind of microstructure, with the production process having a step of wet etching or dry etching, then a step of wet processing (such as etching, cleaning or rinsing for washing away the cleaning liquid), and then a drying step. For example, the processing liquid of the present invention may be suitably used after the etching step in the production process of a semiconductor device or a micromachine, for example, (i) after wet etching of an insulating film around an electroconductive film in the production of a DRAM type semiconductor device (see, for example, JP-A-2000-196038 and JP-A-2004-288710), (ii) after a rinsing step for removing contamination formed after dry etching or wet etching upon processing a gate electrode in the production of a semiconductor device having a transistor with a fin in the form of strips (see, for example, JP-A-2007-335892), and (iii) after a rinsing step for removing contamination formed after etching for forming a cavity by removing a sacrifice layer formed of an insulating film through a through hole in an electroconductive film upon forming a cavity of a micromachine (electrodynamic micromachine) (see, for example, JP-A-2009-122031).

EXAMPLES

The present invention will be described in more detail with reference to Examples, etc., below, but the present invention is not limited to these Examples.

<<Preparation of Processing Liquid>>

Processing liquids for suppressing pattern collapse of a microstructure were prepared according to the formulation compositions (% by mass) as shown in Table 1.

TABLE 1

| | Kind | Number of carbon atoms in alkyl group*1 | Content |
|---|---|---|---|
| Processing liquid 1 | 1-Dodecyl-3-methyl imidazolium chloride | 12 | 5% |
| Processing liquid 2 | 1-Tetradecyl-3-methyl imidazolium chloride | 14 | 500 ppm |
| Processing liquid 3 | 1-Hexadecyl-3-methyl imidazolium chloride | 16 | 100 ppm |
| Processing liquid 4 | Tetradecyl pyridinium chloride | 14 | 10% |
| Processing liquid 5 | 1-Tetradecyl-4-methyl pyridinium chloride | 14 | 1,000 ppm |
| Processing liquid 6 | Hexadecyl pyridinium chloride | 16 | 300 ppm |
| Processing liquid 7 | 1-Hexadecyl-4-methyl pyridinium chloride | 16 | 50 ppm |
| Processing liquid 8 | Hexadecyl trimethyl ammonium chloride | 16 | 1% |
| Processing liquid 9 | Benzyl dimethyl hexadecyl ammonium chloride | 16 | 3,000 ppm |
| Processing liquid 10 | Octadecyl trimethyl ammonium chloride | 18 | 200 ppm |
| Processing liquid 11 | Benzyl dimethyl octadecyl ammonium chloride | 18 | 10 ppm |

*1Number of carbon atoms in an alkyl group contained in respective compounds

Examples 1 to 11

As shown in FIG. 1(a), silicon nitride 103 (thickness: 100 nm) and silicon oxide 102 (thickness: 1,200 nm) were formed as films on a silicon substrate 104, then a photoresist 101 was formed, and the photoresist 101 was exposed and developed, thereby forming a tubular (chimney-shaped) photoresist 105 (diameter: 125 nm, distance between circles: 50 nm), as shown in FIG. 1(b). The silicon oxide 102 was etched by dry etching with the photoresist 105 as a mask, thereby forming a cylindrical hollow 106 reaching the layer of silicon nitride 103, as shown in FIG. 1(c). Upon the dry etching, etching residues 107 remained both inside and outside of the cylindrical hollow. The photoresist 105 was then removed by ashing, thereby providing a structure with the cylindrical hollow 106 formed of silicon oxide and reaching the layer of silicon nitride 103, as shown in FIG. 1(d). The etching residues 107 of the resulting structure were removed by dissolving with a 0.1 wt % hydrofluoric acid aqueous solution (by dipping at 25° C. for 30 seconds), and then the structure was successively processed by making into contact with pure water, the respective processing liquids 1 to 11 shown in Table 1 (by dipping at 30° C. for 10 minutes), and pure water in this order, followed by drying, thereby providing a structure shown in FIG. 1(e).

The resulting structure had a microstructure with a tubular (chimney-shaped) pattern of the silicon oxide (diameter: 125 nm, height: 1,200 nm (aspect ratio: 9.6), distance between the cylindrical hollows: 50 nm), and 70% or more of the pattern was not collapsed.

The pattern collapse was observed with "FE-SEM S-5500 (model number)", produced by Hitachi High-Technologies Corporation, and the collapse suppression ratio was a value obtained by calculating the ratio of the not-collapsed pattern in the total pattern. Cases where the collapse suppression ratio was 50% or more were determined as "passed". The processing liquids, the processing methods and the results of collapse suppression ratios in the respective Examples are shown in Table 3.

Comparative Example 1

The same procedure as in Example 1 was repeated except that after removing the etching residues 107 of the structure as shown in FIG. 1(d) by dissolving with a 0.1 wt % hydrofluoric acid aqueous solution (by dipping at 25° C. for 30 seconds), the structure was processed only with pure water. As a result, 50% or more of the pattern of the resulting structure were collapsed as shown in FIG. 1(f) (which indicated a collapse suppression ratio of less than 50%). The processing liquid, the processing method and the result of collapse suppression ratio in Comparative Example 1 are shown in Table 3.

Comparative Examples 2 to 15

The same procedure as in Example 1 was repeated except that after removing the etching residues 107 of the structures as shown in FIG. 1(d) by dissolving with a 0.1 wt % hydrofluoric acid aqueous solution (by dipping at 25° C. for 30 seconds) and then processing the structures with pure water, the structures were processed with the respective comparative liquids 2 to 15 shown in Table 2 instead of the processing liquid 1. As a result, 50% or more of the pattern of the resulting respective structures were collapsed as shown in FIG. 1(f). The processing liquids, the processing methods and the results of collapse suppression ratios in Comparative Examples 2 to 15 are shown in Table 3.

TABLE 2

| | Name of substance |
|---|---|
| Comparative liquid 1 | Water |
| Comparative liquid 2 | Isopropyl alcohol |
| Comparative liquid 3 | Diethylene glycol monomethyl ether |
| Comparative liquid 4 | Dimethyl acetamide |
| Comparative liquid 5 | Ammonium perfluoroalkyl sulfonate halide*1 |
| Comparative liquid 6 | Perfluoroalkyl carboxylic acid salt*2 |
| Comparative liquid 7 | Adduct of 2,4,7,9-tetramethyl-5-decyne-4,7-diol with ethyleneoxide*3 |
| Comparative liquid 8 | 2,4,7,9-Tetramethyl-5-decyne-4,7-diol*4 |
| Comparative liquid 9 | Polyoxyethylene/polyoxypropylene block polymer*5 |
| Comparative liquid 10 | 1-Decyl-3-methyl imidazolium chloride (number of carbon atoms in alkyl group: 10)*6 |
| Comparative liquid 11 | 1-Dodecyl pyridinium chloride (number of carbon atoms in alkyl group: 12)*7 |
| Comparative liquid 12 | Dodecyl trimethyl ammonium chloride (number of carbon atoms in alkyl group: 12)*8 |
| Comparative liquid 13 | Benzyl dimethyl tetradecyl ammonium chloride (number of carbon atoms in alkyl group: 14)*9 |
| Comparative liquid 14 | Coconut oil fatty acid amide propyl betaine (number of carbon atoms in alkyl group: 12, 14, 16)*10 |
| Comparative liquid 15 | Dimethyl octadecyl amine oxide (number of carbon atoms in alkyl group: 18)*11 |

*1"Fluorad FC-93" (tradename) available from 3M Corp.; specific gravity: 1.1 (25° C.); pH: 7 (0.1% aqueous solution); flash point: 38° C. (as measured by an open cup method); 0.01% aqueous solution
*2"Surflon S-111" (tradename) available from AGC Seimi Chemical Co., Ltd.; specific gravity: 1.0 (20° C.); flash point: 18° C. (as measured by a tag closed cup method); 0.01% aqueous solution
*3"Surfynol 420" (tradename) available from Nisshin Chemical Industry Co., Ltd.; ethyleneoxide content: 20%; 0.01% aqueous solution
*4"Surfynol 104" (tradename) available from Nisshin Chemical Industry Co., Ltd.; 0.01% aqueous solution
*5"Epan 420" (tradename) available from Dai-ichi Kogyo Seiyaku Co., Ltd.; average molecular weight of a hydrophobic group (polyoxypropylene): 1,200; polyoxyethylene content: 20%; 0.01% aqueous solution
*6 to *11 0.01% aqueous solution

TABLE 3

| | Processing method | Collapse suppression ratio*1 | Pass or fail |
|---|---|---|---|
| Example 1 | Pure water → processing liquid 1 → pure water → drying | 80% or more | Pass |
| Example 2 | Pure water → processing liquid 2 → pure water → drying | 80% or more | Pass |
| Example 3 | Pure water → processing liquid 3 → pure water → drying | 80% or more | Pass |
| Example 4 | Pure water → processing liquid 4 → pure water → drying | 80% or more | Pass |
| Example 5 | Pure water → processing liquid 5 → pure water → drying | 80% or more | Pass |
| Example 6 | Pure water → processing liquid 6 → pure water → drying | 80% or more | Pass |
| Example 7 | Pure water → processing liquid 7 → pure water → drying | 70% or more | Pass |
| Example 8 | Pure water → processing liquid 8 → pure water → drying | 80% or more | Pass |
| Example 9 | Pure water → processing liquid 9 → pure water → drying | 70% or more | Pass |
| Example 10 | Pure water → processing liquid 10 → pure water → drying | 80% or more | Pass |
| Example 11 | Pure water → processing liquid 11 → pure water → drying | 70% or more | Pass |
| Comparative Example 1 | Pure water → drying | Less than 50% | Fail |
| Comparative Example 2 | Pure water → comparative liquid 2 → pure water → drying | Less than 50% | Fail |
| Comparative Example 3 | Pure water → comparative liquid 3 → pure water → drying | Less than 50% | Fail |
| Comparative Example 4 | Pure water → comparative liquid 4 → pure water → drying | Less than 50% | Fail |
| Comparative Example 5 | Pure water → comparative liquid 5 → pure water → drying | Less than 50% | Fail |
| Comparative Example 6 | Pure water → comparative liquid 6 → pure water → drying | Less than 50% | Fail |
| Comparative Example 7 | Pure water → comparative liquid 7 → pure water → drying | Less than 50% | Fail |
| Comparative Example 8 | Pure water → comparative liquid 8 → pure water → drying | Less than 50% | Fail |
| Comparative Example 9 | Pure water → comparative liquid 9 → pure water → drying | Less than 50% | Fail |
| Comparative Example 10 | Pure water → comparative liquid 10 → pure water → drying | Less than 50% | Fail |
| Comparative Example 11 | Pure water → comparative liquid 11 → pure water → drying | Less than 50% | Fail |
| Comparative Example 12 | Pure water → comparative liquid 12 → pure water → drying | Less than 50% | Fail |
| Comparative Example 13 | Pure water → comparative liquid 13 → pure water → drying | Less than 50% | Fail |
| Comparative Example 14 | Pure water → comparative liquid 14 → pure water → drying | Less than 50% | Fail |
| Comparative Example 15 | Pure water → comparative liquid 15 → pure water → drying | Less than 50% | Fail |

*1Collapse suppression ratio = [(number of cylindrical hollows not collapsed)/(total number of cylindrical hollows)] × 100 (%)

INDUSTRIAL APPLICABILITY

The processing liquid of the present invention may be suitably used for suppressing pattern collapse upon production of a microstructure formed of silicon oxide, such as a semiconductor device and a micromachine (MEMS).

EXPLANATION OF REFERENCE NUMERALS

101: Photoresist; 102: Silicon oxide; 103: Silicon nitride; 104: Silicon substrate; 105: Circular photoresist; 106: Cylindrical hollow (silicone oxide); 107: Etching residues

The invention claimed is:

1. A processing liquid for suppressing pattern collapse of a microstructure formed of silicon oxide, consisting essentially of water and at least one compound selected from the group consisting of an imidazolium halide comprising an alkyl group having 12, 14 or 16 carbon atoms, a pyridinium halide comprising an alkyl group having 14 or 16 carbon atoms and an ammonium halide halide comprising an alkyl group having 16 or 18 carbon atoms.

2. A processing liquid for suppressing pattern collapse of a microstructure formed of silicon oxide, comprising water and at least one compound selected from the group consisting of an imidazolium halide comprising an alkyl group having 12, 14 or 16 carbon atoms, a pyridinium halide halide comprising an alkyl group having 14 or 16 carbon atoms and an ammonium halide halide comprising an alkyl group having 16 or 18 carbon atoms,
wherein the alkyl group having 12 carbon atoms is a dodecyl group, the alkyl group having 14 carbon atoms is a tetradecyl group, the alkyl group having 16 carbon atoms is a hexadecyl group, and the alkyl group having 18 carbon atoms is an octadecyl group.

3. The processing liquid according to claim 2, wherein the processing liquid comprises said imidazolium halide and the imidazolium halide is at least one compound selected from the group consisting of 1-dodecyl-3-methyl imidazolium chloride, 1-tetradecyl-3-methyl imidazolium chloride and 1-hexadecyl-3-methyl imidazolium chloride.

4. The processing liquid according to claim 2, wherein the processing liquid comprises said pyridinium halide and the pyridinium halide is at least one compound selected from the group consisting of tetradecyl pyridinium chloride, hexadecyl pyridinium chloride, 1-tetradecyl-4-methyl pyridinium chloride and 1-hexadecyl-4-methyl pyridinium chloride.

5. The processing liquid according to claim 2, wherein the processing liquid comprises said ammonium halide and the ammonium halide is at least one compound selected from the group consisting of hexadecyl trimethyl ammonium chloride, octadecyl trimethyl ammonium chloride, benzyl dimethyl hexadecyl ammonium chloride and benzyl dimethyl octadecyl ammonium chloride.

6. The processing liquid according to claim 1, wherein a content of the at least one compound selected from the group consisting of the imidazolium halide, the pyridinium halide and the ammonium halide in the processing liquid is from 10 ppm to 10%.

7. A method for producing a microstructure formed of silicon oxide, comprising:
subjecting a structure to wet etching or dry etching to obtain the microstructure; and
rinsing the microstructure obtained by the wet etching or dry etching with a processing liquid for suppressing pattern collapse of the microstructure, the processing liquid comprising water and at least one compound selected from the group consisting of an imidazolium halide comprising an alkyl group having 12, 14 or 16 carbon atoms, a pyridinium halide comprising an alkyl group having 14 or 16 carbon atoms and an ammonium halide comprising an alkyl group having 16 or 18 carbon atoms.

8. The method according to claim 7, wherein the microstructure formed of silicon oxide is a semiconductor device or a micromachine.

9. The method according to claim 7, wherein the processing liquid consists essentially of said water and said at least one compound selected from the group consisting of an imidazolium halide comprising an alkyl group having 12, 14 or 16 carbon atoms, a pyridinium halide comprising an alkyl group having 14 or 16 carbon atoms and an ammonium halide comprising an alkyl group having 16 or 18 carbon atoms.

10. The method according to claim 7, wherein the alkyl group having 12 carbon atoms is a dodecyl group, the alkyl group having 14 carbon atoms is a tetradecyl group, the alkyl group having 16 carbon atoms is a hexadecyl group, and the alkyl group having 18 carbon atoms is an octadecyl group.

11. The method according to claim 7, wherein the processing liquid comprises said imidazolium halide and the imidazolium halide is at least one compound selected from the group consisting of 1-dodecyl-3-methyl imidazolium chloride, 1-tetradecyl-3-methyl imidazolium chloride and 1-hexadecyl-3-methyl imidazolium chloride.

12. The method according to claim 7, wherein the processing liquid comprises said pyridinium halide and the pyridinium halide is at least one compound selected from the group consisting of tetradecyl pyridinium chloride, hexadecyl pyridinium chloride, 1-tetradecyl-4-methyl pyridinium chloride and 1-hexadecyl-4-methyl pyridinium chloride.

13. The method according to claim 7, wherein the processing liquid comprises said ammonium halide and the ammonium halide is at least one compound selected from the group consisting of hexadecyl trimethyl ammonium chloride, octadecyl trimethyl ammonium chloride, benzyl dimethyl hexadecyl ammonium chloride and benzyl dimethyl octadecyl ammonium chloride.

14. The processing liquid according to claim 1, wherein the alkyl group having 12 carbon atoms is a dodecyl group, the alkyl group having 14 carbon atoms is a tetradecyl group, the alkyl group having 16 carbon atoms is a hexadecyl group, and the alkyl group having 18 carbon atoms is an octadecyl group.

15. The processing liquid according to claim 1, wherein the processing liquid comprises said imidazolium halide and the imidazolium halide is at least one compound selected from the group consisting of 1-dodecyl-3-methyl imidazolium chloride, 1-tetradecyl-3-methyl imidazolium chloride and 1-hexadecyl-3-methyl imidazolium chloride.

16. The processing liquid according to claim 1, wherein the processing liquid comprises said pyridinium halide and the pyridinium halide is at least one compound selected from the group consisting of tetradecyl pyridinium chloride, hexadecyl pyridinium chloride, 1-tetradecyl-4-methyl pyridinium chloride and 1-hexadecyl-4-methyl pyridinium chloride.

17. The processing liquid according to claim 1, wherein the processing liquid comprises said ammonium halide and the ammonium halide is at least one compound selected from the group consisting of hexadecyl trimethyl ammonium chloride, octadecyl trimethyl ammonium chloride, benzyl dimethyl hexadecyl ammonium chloride and benzyl dimethyl octadecyl ammonium chloride.

* * * * *